(12) United States Patent
Zhan et al.

(10) Patent No.: US 7,763,947 B2
(45) Date of Patent: *Jul. 27, 2010

(54) PIEZO-DIODE CANTILEVER MEMS

(75) Inventors: Changqing Zhan, Vancouver, WA (US);
Paul J. Schuele, Washougal, WA (US);
John F. Conley, Jr., Camas, WA (US);
John W. Hartzell, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 72 days.

This patent is subject to a terminal disclaimer.

(21) Appl. No.: 11/717,231

(22) Filed: Mar. 13, 2007

(65) Prior Publication Data

US 2007/0278600 A1      Dec. 6, 2007

(51) Int. Cl.
*H01L 41/113* (2006.01)
(52) U.S. Cl. ............... 257/417; 257/656; 257/E29.324
(58) Field of Classification Search .............. 257/415, 257/417, 656, E29.324
See application file for complete search history.

(56) References Cited

U.S. PATENT DOCUMENTS 5,600,174 A * 2/1997 Reay et al. ................. 257/467
5,682,053 A * 10/1997 Wiszniewski ............... 257/401
6,049,115 A    4/2000 Takahashi
6,211,540 B1 * 4/2001 Takahashi et al. .......... 257/252

2005/0130360 A1    6/2005 Zhan et al.

FOREIGN PATENT DOCUMENTS

| JP | 9-64404 | 3/1997 |
| JP | 2003-124222 | 4/2003 |
| JP | 2006-187060 | 7/2006 |
| JP | 2006-224219 | 8/2006 |

OTHER PUBLICATIONS

Vinayak P Dravid and Gajendra S Shekhawat; "MOSFET Integrated Microcantilevers for Novel Electronic Detection of "On-Chip" Molecular Interactions", Material Science, Northwestern University, Evanston, Illinois], Apr. 14, 2004, p. 451.

(Continued)

*Primary Examiner*—Allan R. Wilson
(74) *Attorney, Agent, or Firm*—Law Office of Gerald Maliszewski; Gerald Maliszewski

(57) ABSTRACT

A piezo thin-film diode (piezo-diode) cantilever microelectromechanical system (MEMS) and associated fabrication processes are provided. The method deposits thin-films overlying a substrate. The substrate can be made of glass, polymer, quartz, metal foil, Si, sapphire, ceramic, or compound semiconductor materials. Amorphous silicon (a-Si), polycrystalline Si (poly-Si), oxides, a-SiGe, poly-SiGe, metals, metal-containing compounds, nitrides, polymers, ceramic films, magnetic films, and compound semiconductor materials are some examples of thin-film materials. A cantilever beam is formed from the thin-films, and a diode is embedded with the cantilever beam. The diode is made from a thin-film shared in common with the cantilever beam. The shared thin-film may a film overlying a cantilever beam top surface, a thin-film overlying a cantilever beam bottom surface, or a thin-film embedded within the cantilever beam.

10 Claims, 8 Drawing Sheets

OTHER PUBLICATIONS

Joao Gaspar, Haohua Li, Paulo Peieiro Freitas, "Integrated Magnetic Sensing of Electro-statically Actuated Thin-Film Microbridges", Journal of MicroElectroMechanical Systems, vol. 12, No. 5, Oct. 2003, p. 550-556.

M. Utsunomiya and A. Yoshida, "Effect of mechanical strain on electrical characteristics of hydrogenated amorphous silicon junctions", J. Appl. Phys. 66 (1), 1989, pp. 308-311.

J. Harley and T. Kenny, "High-sensitivity piezoresistive cantilevers under 1000 A thick" Appl. Phys. Lett. vol. 75, No. 2, 1999, pp. 289-291.

P. Rasmussen, et al, "Optimized cantilever biosensor with piezoresistive read-out" Ultramicroscopy 97, 2003, pp. 371-176.

\* cited by examiner

PIEZO-DIODE CANTILEVER MEMS

BACKGROUND OF THE INVENTION

1. Field of the Invention

This invention generally relates to the fabrication of microelectromechanical systems (MEMS) and, more particularly, to a thin-film diode cantilever MEMS and related fabrication procedures.

2. Description of the Related Art

Active devices such as thin-film transistors (TFTs) and diodes are formed through deposition processes that create thin films of silicon (Si) and insulator material. While the resulting devices may not have the switching speed and drive capability of devices formed on single-crystal substrates, they can be fabricated cheaply with a relatively few number of process steps. Further, thin-film deposition processes permit active devices to be formed on alternate substrate materials, such as transparent glass substrates, for use in liquid crystal displays (LCDs). More specifically, the active devices may include a deposited amorphous Si (a-Si) layer. To improve the performance of the device, the a-Si may be crystallized to form polysilicon, at the cost of some extra processing. The crystallization procedures are also limited by the temperature sensitivity of the substrate material. For example, glass substrates are known to degrade at temperatures over 650 degrees C. Large scaled devices, integrated circuits, and panel displays are conventionally made using thin-film deposition processes.

MEMS devices are a logical derivative of semiconductor IC processes that may be used to develop micrometer scale structural devices such as transducers or actuators. MEMS devices interface physical variables and electronic signal circuits. MEMS structures are varied and, therefore, more difficult to standardize, as compared to the above-mentioned thin film processes. On the other hand, it may be possible to develop MEMS devices by engineering modifications to well-developed silicon IC processes. Many of the MEMS devices that have been fabricated to date have more theoretical than practical application, as the devices are often difficult and expensive to make. For the same reason, larger scale systems using MEMS components have been expensive to fabricate due to the process difficulties and the cost associated with integrating the MEMS and IC technologies.

For example, transistors and associated MEMS structures have been fabricated on bulk Si substrates, and the authors claim excellent performing biochemical sensing MEMS transducers [Vinayak P Dravid and Gajendra S Shekhawat; "MOSFET Integrated Microcantilevers for Novel Electronic Detection of "On-Chip" Molecular Interactions", Material Science, Northwestern University, Evanston, Ill.]. However, the etching processes needed to form a bulk silicon MEMS are more difficult to control, dramatically limit available process steps, and require long etch times. These limitations make these devices unsuitable for low-cost integrated systems.

Alternately, MEMS structures made using high temperature LPCVD thin films have been built with conventional sensing schemes such as capacitive and/or piezoresistive bridges, generating reasonable output signals [(1) William P. Eaton, James H. Smith, David J. Monk, Gary O'Brien, and Todd F. Miller, "Comparison of Bulk- and Surface-Micromachined Pressure Sensors", *Micromahined Devices and Components, Proc.* SPIE, Vol. 3514, P. 431. (2) Joao Gaspar, Haohua Li, Paulo Peieiro Freitas, "Integrated Magnetic Sensing of Electro-statically Actuated Thin-Film Microbridges", Journal of MicroElectroMechanical Systems, Vol. 12, No. 5, October. 2003, p. 550-556]. However, these sensing schemes cannot be applied to low temperature TFT process, because the changes in electrical characteristics induced as a result of stress change are too small to be practically measured.

Stress is induced on a surface when bio-molecules become immobilized on a solid surface. This property is one of the most promising avenues to explore for bio-sensing. To detect the surface stress, a thin cantilever may be used. The selective absorption or immobilization of molecules on one side of the cantilever creates a surface stress difference between the two sides of the cantilever, and this difference is measured via a change in electrical resistance using an integrated piezoresistor transducer. Alternately, the substantial displacement at the cantilever tip can be detected by an atomic force microscope (AFM). AFM has the best sensitivity, but its expense and complexity prevent it from being widely used. Some key design issues include strain sensitivity and the electrical noise inherent in the sensor. These problems are conventionally addressed by using a single crystal silicon substrate.

Electrically passive piezoresistive cantilever transducers have been studied and demonstrate bio-sensing capabilities for low surface stress sensing. Limited by single crystal silicon anisotropic fabrication processes and relatively poor sensitivity, it is difficult to fabricate a piezoresistive cantilever sensor array at low cost. Prior art devices are usually formed on silicon-on-insulator (SOI) wafers, using high temperature processes and special tools such as deep reactive ion etching (RIE). Bulk micromachining uses a subtractive process to carve the MEMS structure out of the bulk substrate (typically a silicon wafer).

It would be advantageous if a high sensitivity MEMS cantilever could be formed with an integrated active device from laser annealed thin-films, without the necessity of a single crystal silicon substrate or bulk micromachining processes.

SUMMARY OF THE INVENTION

Sensitivity and signal-to-noise ratio are two important parameters for MEMS sensors. The present invention piezo-diode cantilever MEMS sensor converts mechanical energy (surface stress) induced on a molecule-solid interface to electrical energy. Reducing the MEMS structure thickness effectively enhances the mechanical strain induced by surface stress. In one aspect, the present invention uses a plasma enhanced chemical vapor deposition (PECVD) method to control the MEMS structure thickness, and uses a pre-deposited sacrificial film to support the MEMS structure fabrication and define the air gap between a MEMS structure and the substrate. The sacrificial film is removed to free the MEMS structure after all fabrication steps are completed. While the prior art uses either a SOI substrate to control MEMS structure thickness or a high temperature LPCVD process, the present invention sensor can be fabricated on any substrate, using conventional mass production processes for low cost consumer applications, due to the low process temperature of the PECVD processes.

The conversion of mechanical strain to an electrical signal is accomplished using a P-I-N or PIN diode integrated on a MEMS cantilever. If the P-I-N diode is fabricated on an amorphous film, the mechanical strain change on the amorphous film affects its current transport mechanism in the diode, resulting in a change in electrical current. Such a piezo effect is prominent and as a result the gauge factor (the relative current change per strain change) of an amorphous film P-I-N is as high as the gauge factor (the relative resistance change per strain change) of a single crystal silicon piezoresistor. To take the advantage of this unique property of amorphous Si, a P-I-N diode junction can be used as a mechanical strain-to-electrical signal conversion transducer.

However, due to the high density of defects in amorphous silicon, the strain across a large surface area is required to create current changes large enough to easily detect. The present invention piezo-diode MEMS sensor addresses this issue by using laser-crystallized silicon instead of amorphous silicon to form P-I-N diode junctions. Laser-crystallized silicon has a better lattice quality, so carriers have a much higher mobility. Therefore, a much smaller junction area is needed to generate detectable changes in current due to surface stress.

Accordingly, a method is provided for fabricating a piezo thin-film diode (piezo-diode) cantilever microelectromechanical system (MEMS), the method provides a substrate and deposits thin-films overlying the substrate. The substrate can be made of glass, polymer, quartz, metal foil, Si, sapphire, ceramic, or compound semiconductor materials. Amorphous silicon (a-Si), polycrystalline Si (poly-Si), oxides, a-SiGe, poly-SiGe, metals, metal-containing compounds, nitrides, polymers, ceramic films, magnetic films, and compound semiconductor materials are some examples of thin-film materials. A cantilever beam is formed from the thin-films, and a diode is embedded with the cantilever beam. The diode is made from a thin-film shared in common with the cantilever beam. The shared thin-film may be a film overlying a cantilever beam top surface, a thin-film overlying a cantilever beam bottom surface, or a thin-film embedded within the cantilever beam.

Subsequent to depositing the thin-films, in one aspect the thin-films are annealed by heating the substrate to a temperature exceeding 800° C. Then, subsequent to annealing, metal interconnects are formed to the diode P and N electrodes. In another aspect, the method forms a lateral PIN diode, having a serpentine pattern in a Si thin-film layer.

Additional details of the above-described method and an associated piezo-diode cantilever MEMS are provided below.

DETAILED DESCRIPTION

Figure 1:
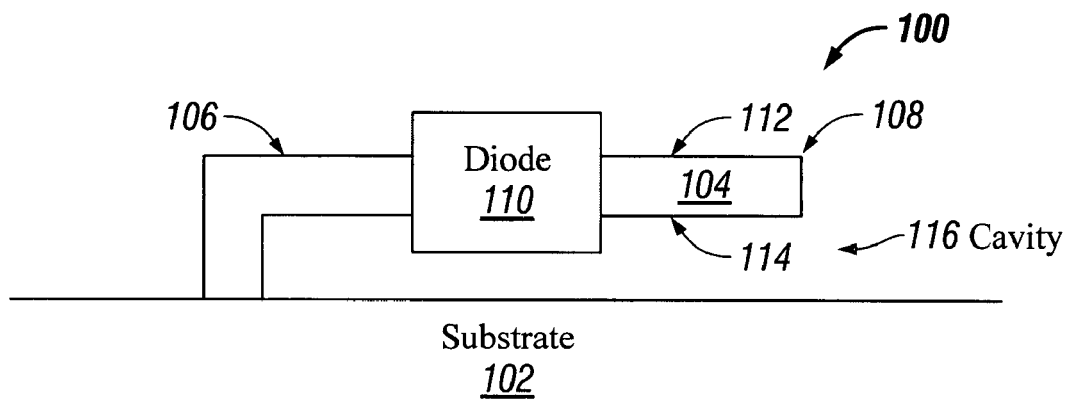
FIG. 1 is a partial cross-sectional view of a piezo thin-film diode (piezo-diode) cantilever microelectromechanical system (MEMS).

FIG. 1 is a partial cross-sectional view of a piezo thin-film diode (piezo-diode) cantilever microelectromechanical system (MEMS). The piezo-diode cantilever 100 comprises a substrate 102. Some possible substrate materials include glass, polymer, quartz, metal foil, Si, Si-containing materials, sapphire, ceramic, and compound semiconductor materials, such as Si-germanium for example. A multi-layered film cantilever beam 104 has a distal end 106 anchored to the substrate 102, and a proximal end 108. A diode 110 is embedded in the cantilever beam 104 and shares a film layer in common with the cantilever beam 104. The cantilever beam 104 has a top surface 112 and a bottom surface 114. A cavity 116 is formed between the cantilever beam proximal end 108 and the substrate 102.

The cantilever body can be a rectangular as shown, or shaped (e.g., as a triangle, circle, or oval), with one or multiple points for anchoring to the substrate. The cantilever beam 104 and diode 110 film layers may be made from materials such as amorphous silicon (a-Si), polycrystalline Si (poly-Si), oxides, a-SiGe, poly-SiGe, metals, metal-containing compounds, nitrides, polymers, Si-containing materials, ceramic films, magnetic films, compound semiconductor materials, or combinations of the above-mentioned materials. The above-mentioned lists are not intended to be an exhaustive list of every possible material, but rather some examples of substrates and materials that can be deposited using conventional thin-film deposition processes.

As used herein, a "thin-film" is defined as a film that is formed by a deposition process. Although the thin-films may be etched after deposition to create patterns, thin-film layers are often approximately the same as the original film deposition thickness. Thin-film thicknesses vary according to the material and specific deposition process. Typically however, a thin-film has a thickness of less than 1 micrometer. Some of the processes used to deposit thin-films include chemical vapor deposition (CVD), sputtering, evaporation, molecular beam epitaxy (MBE), and spin-coating.

Figure 2A:
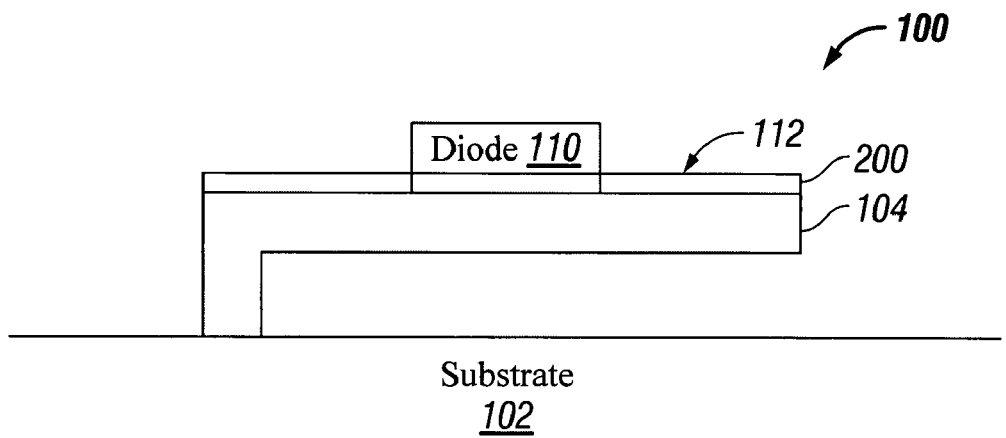
FIGS. 2A through 2C are partial cross-sectional views depicting examples of thin-film layers shared by the cantilever beam and diode.
Figure 2B:
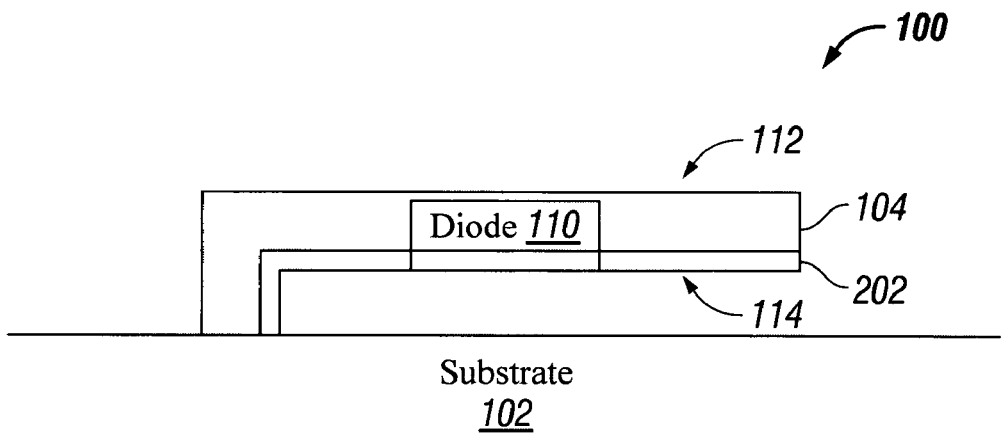
Figure 2C:
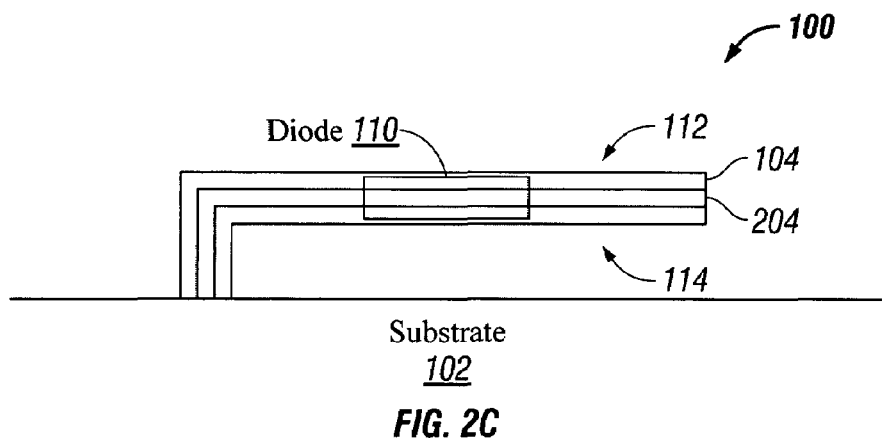

FIGS. 2A through 2C are partial cross-sectional views depicting examples of thin-film layers shared by the cantilever beam and diode. In FIG. 2A, the diode 110 is formed in a film layer 200 overlying the cantilever beam top surface 112. In FIG. 2B, the diode 110 is formed in a film layer 202 overlying the cantilever beam bottom surface 114. In FIG. 2C, the diode 110 is formed in a film layer 204 embedded within the cantilever beam 104. Although not specifically shown, it should be understood that the diodes and cantilever beams made from multiple thin-film layers. Further, the diode and cantilever beam may share multiple thin-film layers.

Figure 3:
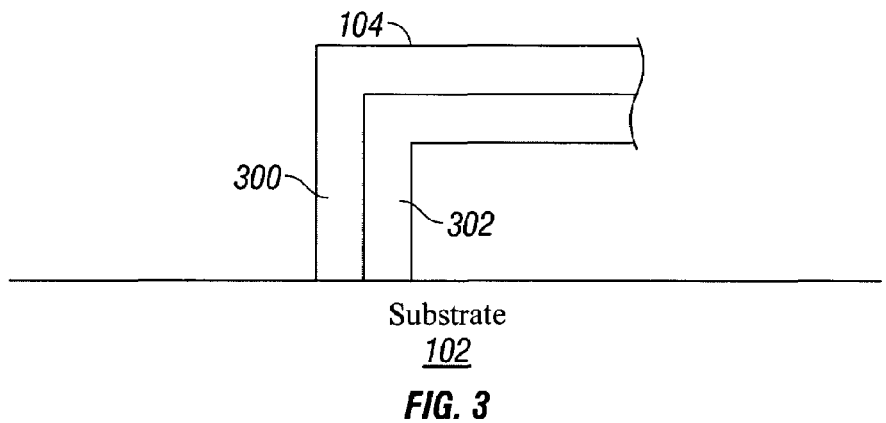
FIG. 3 is a partial cross-sectional view of a piezo-diode cantilever beam section made from two thin-film layers.

FIG. 3 is a partial cross-sectional view of a piezo-diode cantilever beam section made from two thin-film layers. Depending on the types of materials used for example, a first film layer 300 may have a first stress level or stress condition, while a second film layer 302 has a second stress level overlying the first layer 300. The differences in stress between the two layers may be a design choice to maximize the movement of the cantilever beam under the influence of environment, biological influences, or physical forces. In some aspects, the two film layers may be the same material, but formed under different deposition conditions or exposed to different post-deposition processes. Although not specifically shown, the cantilever beam may be formed with more than two film layers, where differences in stress between the multiple film layers contribute to the reactions of the cantilever beam to environmental influences.

The differences in stress between the first layer 300 and the second layer 302 may be managed to ensure that the cantilever bends "up", as bending down may cause the cantilever beam to stick to the substrate. These built-in stresses act upon the cantilever diode regions and result in electron mobility enhancement. This mobility enhancement is reflected in the diode static characteristics, making the diode more sensitive to any longitudinal strain change caused by external forces, temperatures, chemical reactions and the like, acting upon the cantilever beam 104. In other words, the built-in stress of the cantilever helps to enhance the static characteristics of diode via straining the active Si region to enhance the electron mobility. Any longitudinal strain change caused by external forces, temperatures, chemical reactions and the like, acting upon the cantilever beam 104 results in additional electron mobility changes, on top of the static electron mobility induced by the built-in stress. In this manner, the stress change acting upon the active Si region can be determined as a result of measuring changes in current through the diode. Although not specifically shown, input and output conductive traces are formed in one or more of the film layers, from the substrate to the diode, to communicate electrical signals and supply dc power. The cantilever with diode converts external physical variables such as forces, velocities, accelerations, rotations, temperature changes, surface tension changes, photon input, and the like, to electrical signals.

Figure 4A:
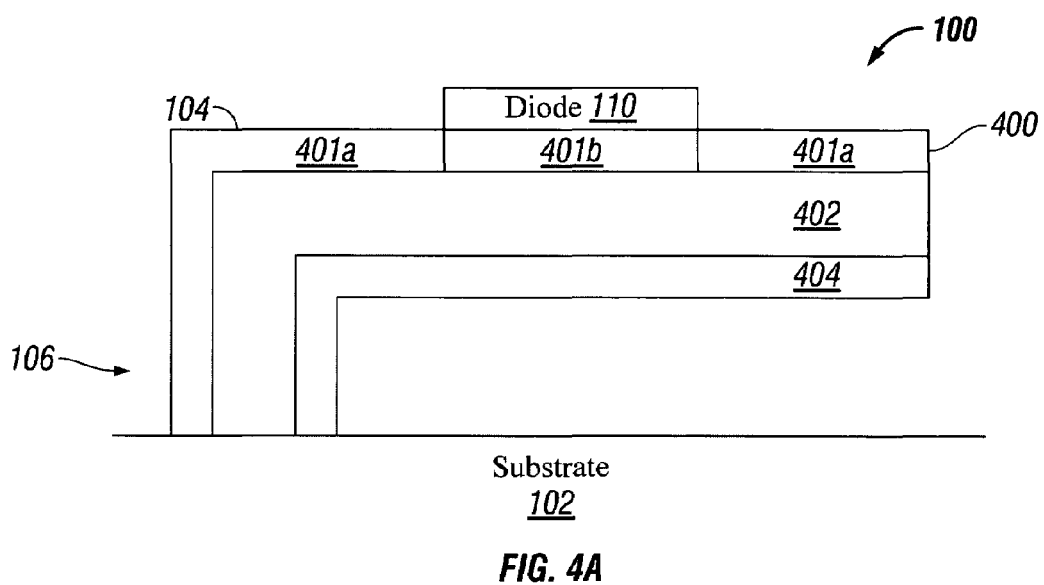
FIGS. 4A and 4B are partial cross-sectional views of a cantilever beam and diode sharing a common film layer.
Figure 4B:
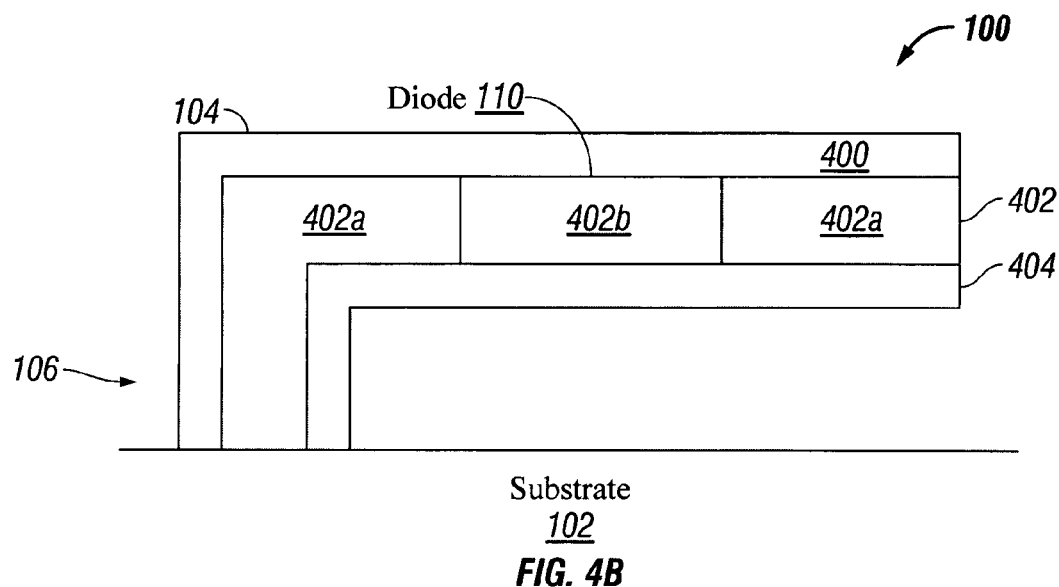

FIGS. 4A and 4B are partial cross-sectional views of a cantilever beam and diode sharing a common film layer. In FIG. 4A the cantilever beam 104 is formed from a first film layer 400, made from a first material and having a first crystalline structure 401a. The diode 110 is formed from the first film layer 400 and has a second crystalline structure 401b different from the first crystalline structure 401a. For example, the first film layer 400 may be Si, the first crystalline structure 401a may be amorphous, and the second crystalline structure 401b may be polycrystalline. As shown, the first film layer 400 may overlie other film layers. Film layers 402 and 404 are shown. Alternately but not shown, the first film layer may be embedded between other film layers, or underlie the cantilever beam bottom surface.

As used herein, a-Si and micro-crystalline Si are defined as a Si film layer having an average grain size of less than 0.1 micrometers. Polycrystalline Si is defined herein as having an average grain size larger than 0.1 micrometers. In one aspect, the diode is formed from at least one Si active film layer, which may be either a-Si or polycrystalline Si, CVD deposited at relative low temperatures and treated by either a laser or low temperature annealing process. Since the cantilever and diode share the deposited active film, the diode need not be fabricated on SOI or a single crystal substrate. Rather, the cantilever and diode are fabricated from thin-films that are subject to etching and/or surface micromachining techniques. Surface micromachining fabricates the MEMS device using an additive process wherein successive layers of sacrificial layers and thin-films are deposited on top of an unetched substrate. Surface micromachined devices can be fabricated on any substrate compatible with thin-film processing.

Because of the differences in crystalline structure, the cantilever beam first film layer has a first stress level, resulting from the first crystalline structure 401a. Likewise, the diode first film layer has a second stress level, different from the first stress level, as a result of the second crystalline structure 401b. Alternately stated, the film layer shared by the cantilever beam and diode may have different mechanical characteristics, even though the film is made from the same material. For example, the first film 400 may been initially formed with an amorphous structure 401a, and have been subject to a laser annealing process that formed a polycrystalline structure 401b is the area to be occupied by the diode 110. Such a process would improve electron mobility through the diode.

By selectively annealing the active regions and non-active cantilever regions, desired electrical and mechanical characteristics on different regions can be managed in the same process step, by programming the laser anneal system. Even if the cantilever is made from Si oxide, the oxide layers may be laser annealed, in the same or different process steps than the annealing of the diode Si active layer, to alter mechanical characteristics of the beam 104.

The annealing may occur is the same or separate annealing processes. Even if annealed in the same process step, two regions may be subject to different fluences, time durations, or number of laser shots. In this manner, the grain size in the diode active region can selectively be made larger than in adjoining regions. Also, this laser annealing process permits the mechanical characteristics of a film layer to be altered independent of the rest of the materials on the substrate.

Alternately, different regions of the same film layer may have different electrical properties. That is, two regions in the same film layer need not necessarily have a different crystalline structure, to differentiated by electrical characteristics.

For example, in FIG. 4B region 402b may be doped to enhance electron mobility, and so be suitable as a diode active layer. Thus, device 100 may be explained as an integrated electromechanical stress sensor 100 having a distal end 106 anchored to the substrate 102. The cantilever beam 104 includes a plurality of film layers (e.g., 400, 402, 404) including a first film layer responsive to stress induced on a beam surface 406, and a diode 110 formed in the film layer. Note; since stress on the surface 406 is translated to underlying layers, the first film layer need not necessarily be film layer 400. That is, the cantilever beam 104 includes a film layer (e.g., layer 402), with a diode 110 having an active region 402b formed in the film layer.

In another aspect, the device of FIG. 4A or 4B may be seen as cantilever diode 100. The diode 100 includes a cantilevered film layer (e.g., 400 or 402) having a distal end 106 anchored to the substrate 102, responsive to environmentally-induced stress. The diode 100 also includes an active Si region 401b (FIG. 4a) or 402b (FIG. 4B) formed in the film layer 400 (FIG. 4A) or 402 (FIG. 4B).

Alternately, the device of FIG. 4A or 4B can be described as a cantilevered microelectromechanical system (MEMS) diode 100. The cantilevered MEMS diode 100 comprises a substrate 102, and a plurality of cantilevered film layers (e.g. 400, 402, and 404) having a distal end 106 anchored to the substrate. An active Si region 401b (FIG. 4A) or 402b (FIG. 4B) is formed in one of the cantilevered film layers. As shown, the active region is associated with diode 110. However, in other variations the active region could be a transistor active layer. Although only a single active layer 401b or 402b is shown, as would to case in a lateral diode or planar transistor, in other aspects not shown, multiple active layers may be stacked to form a vertical structure. It should be understood that a "cantilevered film layer" is understood to be a film layer that is an integral part of the cantilever structure, and not a film layer overlying a region of the substrate adjacent the cantilever, which may have been deposited simultaneously with a cantilevered film layer.

Figure 5A:
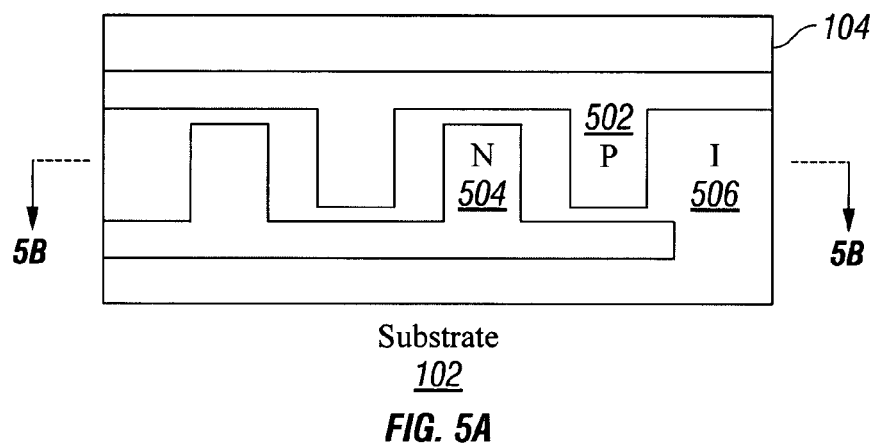
FIGS. 5A and 5B are plan and partial cross-sectional views, respectively, of a piezo-diode cantilever MEMS formed form a lateral PIN diode.
Figure 5B:
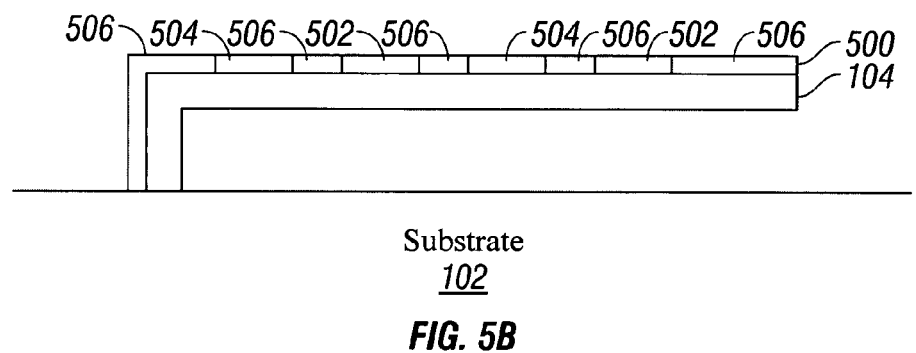

FIGS. 5A and 5B are plan and partial cross-sectional views, respectively, of a piezo-diode cantilever MEMS formed from a lateral PIN diode. The lateral PIN diode 110 has a serpentine pattern formed in a Si film layer 500 overlying the cantilever beam top surface 112, made from a p-doped region 502, n-doped region 504, and intrinsic region 506. Alternately but not shown, the lateral PIN diode may be formed on a Si film layer embedded with the cantilever beam 104, where embedding is defined as covered with overlying and underlying film layers.

Functional Description

The present invention piezo-diode cantilever MEMS converts mechanical energy (surface stress) induced on a molecule-solid interface to electrical energy. Reduced MEMS structure thicknesses can effectively enhance the mechanical strain induced by surface stress. To that end, the device is formed from thin-films deposited using a plasma enhanced chemical vapor deposition (PECVD) method for example, to control the MEMS structure thickness. Pre-deposited sacrificial films can be used to support the MEMS structure fabrication and define the air gap between the MEMS structure and the substrate. The sacrificial film is removed to free the MEMS structure after all fabrication steps are completed. Due to the low process temperature of PECVD, the device can be integrated into any mass production substrate for low cost consumer applications.

The conversion from mechanical strain to electrical signal is accomplished using a P-I-N diode integrated on a MEMS cantilever. The mechanical strain change on the P-I-N diode active layer(s) affects the diode's current transport mechanism, resulting in the electrical current change. Due to the high density of defects in amorphous silicon, laser-crystallized silicon can be used to instead of amorphous silicon in the P-I-N junctions. Laser-crystallized silicon has better lattice quality, so carriers have much high mobility, and the junction area can be made smaller. Further, diodes made from laser-crystallized silicon films have less intrinsic noise and better detection resolution. The overall power consumption can be made small if the piezo P-I-N diode is reverse biased at low current. As described below, the diode can be made from lateral or planar junctions.

To integrate the present invention MEMS transducer on a low cost substrate using low temperature processes, without sacrificing sensitivity, the transducer can be made from laser-crystallized silicon P-I-N junctions, and integrated on a low temperature PECVD TEOS silicon dioxide cantilever, using PECVD amorphous silicon as the sacrificial film. At the end of the fabrication process, TMAH or XeF2 can be used to remove sacrificial film and free the cantilever from the underlying substrate.

Figure 6A:
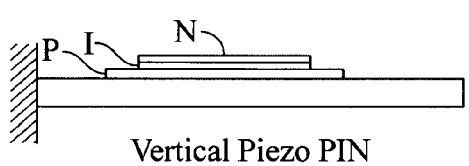
FIGS. 6A through 6C depict partial cross-sectional and plan views for three types of piezo P-I-N cantilever transducers.
Figure 6A:
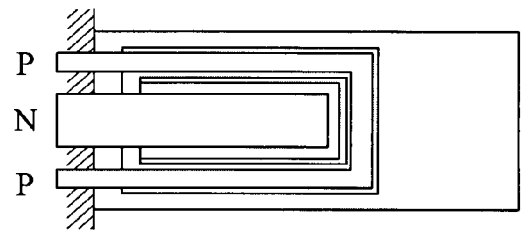
Figure 6B:
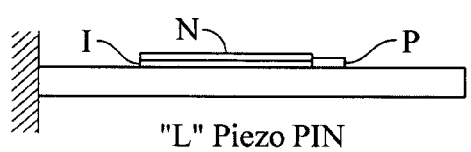
Figure 6B:
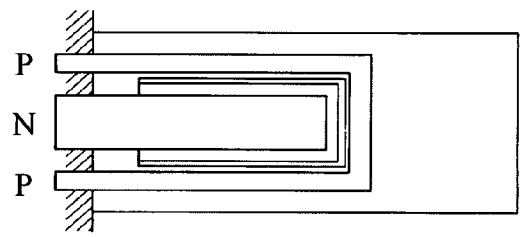
Figure 6C:
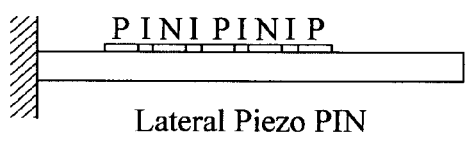
Figure 6C:
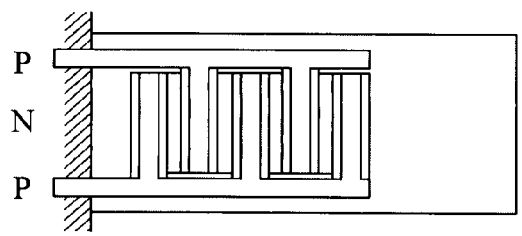

FIGS. 6A through 6C depict partial cross-sectional and plan views for three types of piezo P-I-N cantilever transducers. FIG. 6A depicts a vertical junction design, FIG. 6B depicts a lateral junction design, FIG. 6C depicts an "L" junction design. The vertical design has the largest junction area and it is the most straight-forward design. However, separate deposition and doping steps are required to form the P, I and N regions. The lateral design has simplest structure, but the junction area is limited. The "L" junction design is the tradeoff between the vertical junction design and the lateral junction design, offering greater flexibility in fabrication, to optimize transducer performance.

Table 1 compares the differences in performance between the piezo P-I-N diode cantilever and a piezoresistor device formed on a single crystal Si substrate. Besides maintaining the same level sensitivity as single crystal silicon piezoresistor, the piezo P-I-N transducer consumes less power, has less 1/f noise, and is fully compatible with low temperature IC fabrication processes.

TABLE 1

Piezo P-I-N vs. Piezoresistor comparisons

|  | Laser-crystallized silicon Piezo P-I-N | Single crystal silicon Piezoresistor |
|---|---|---|
| Sensitivity | High | High |
| Power consumption | Low | High |
| Interface scattering | Low | Low |
| Temperature sensitivity | High | High |
| Carrier polarity | Bipolar | majority carrier |
| Major noise mechanism | Thermal | Thermal and 1/f |
| Process complexity | Low | Low |
| Integration flexibility with low temperature process | High | Low |
| Detection circuits requirements | Low | Low |

Figure 7:
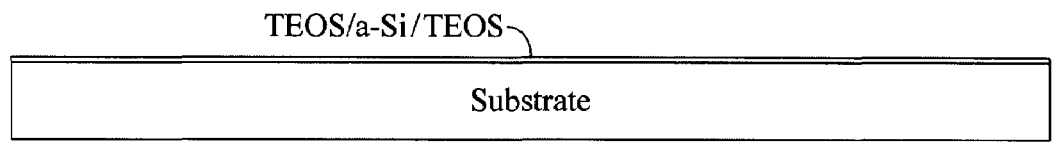
FIGS. 7 through 19 depict steps in an exemplary piezo-diode cantilever MEMS fabrication process.
Figure 8:
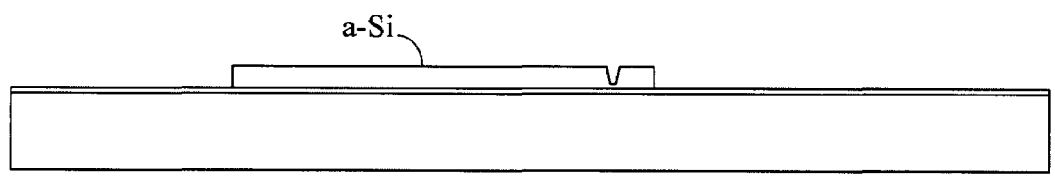

FIGS. 7 through 19 depict steps in an exemplary piezo-diode cantilever MEMS fabrication process. In FIG. 7 the process starts with any substrate. TEOS is deposited to a thickness of 1500 Å using a PECVD process. Then, a 5000 Å a-Si mask is formed, and the a-Si mask is patterned to obtain alignment marks. A PECVD process is used to deposit tensile-stressed silicon oxide to a thickness of about 1500 Å. In FIG. 8 a PECVD process deposits 1.5 micrometers (um) of a-Si. An RIE etch is performed on the a-Si to define a sacrificial mesa in MEMS area. A mask is used to define dimples, time-etched into the a-Si mesa about 1 um deep.

Figure 9:
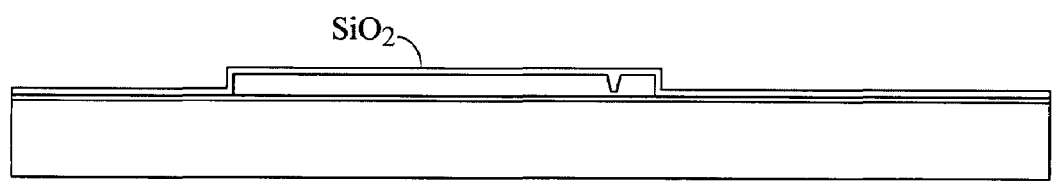
Figure 10:
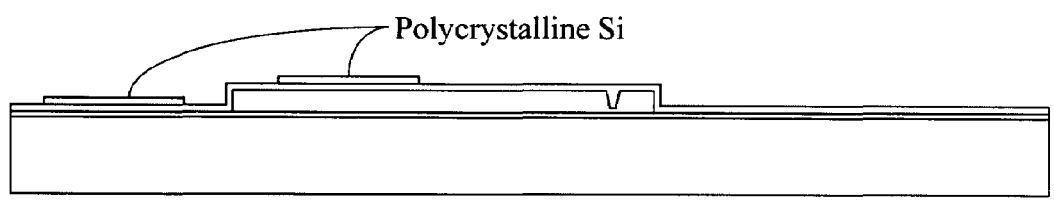

In FIG. 9 a PECVD process deposits 2500 Å of low stress TEOS SiO2 and 500 Å of standard TEOS SiO2 as a "base coat". In FIG. 10 a PECVD process deposits 1000 Å of α-Si, which is laser-crystallized to form polycrystalline Si.

Figure 11:
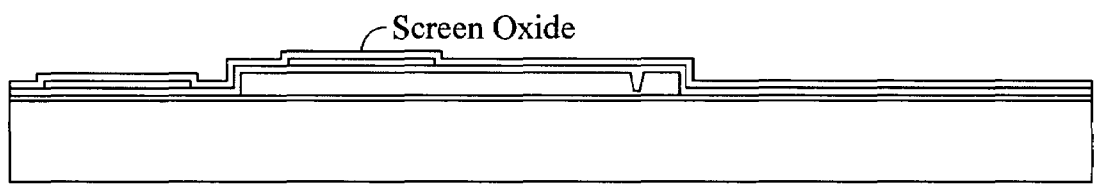
Figure 12:
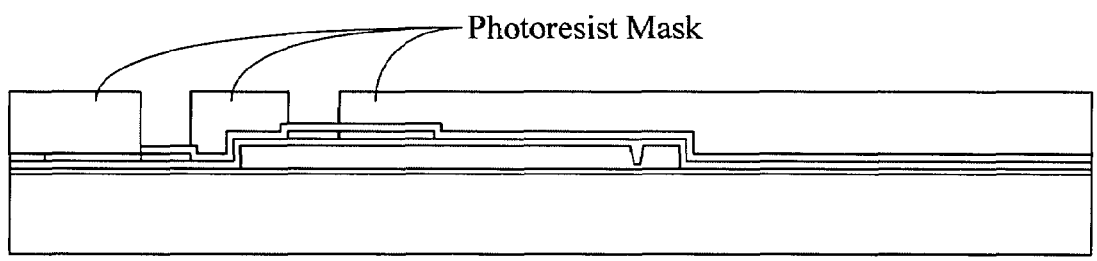
Figure 13:
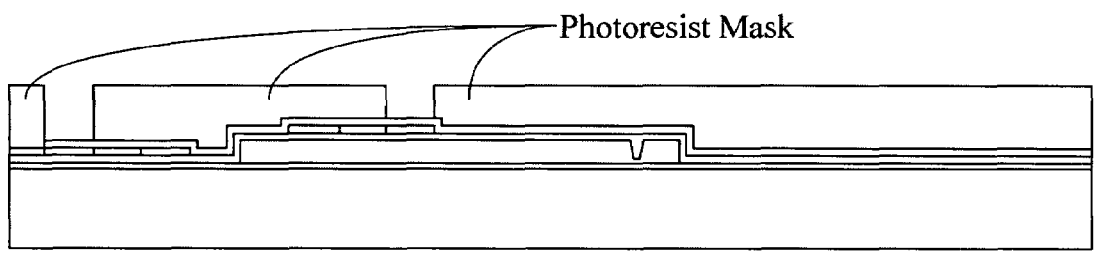
Figure 14:
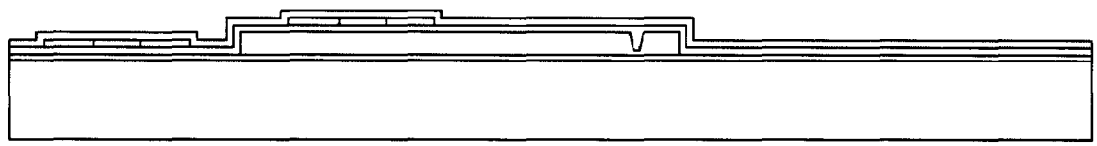
Figure 15:
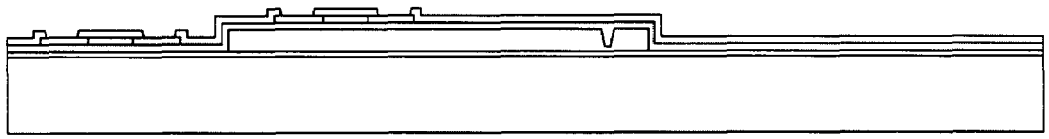
Figure 16:
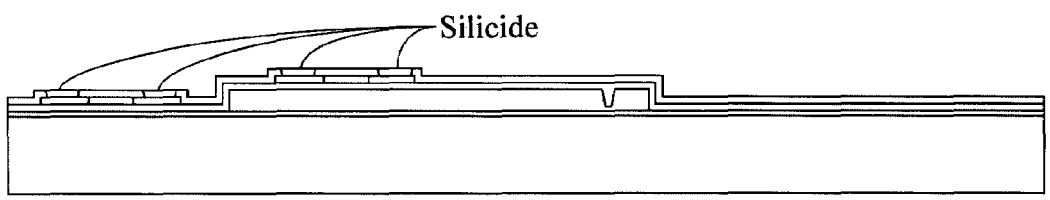

In FIG. 11, a CVD process forms a 500 Å thick screen oxide. In FIG. 12 a photoresist mask is used for P+ implantation. In FIG. 13 another photoresist mask is formed for N+ implantation. In FIG. 14 an activation anneal is performed after the dopant implantation. In FIG. 15 contact hole openings are made, and in FIG. 16 silicide is formed in the opening to serve as electrical interconnections to the diode.

Figure 17:
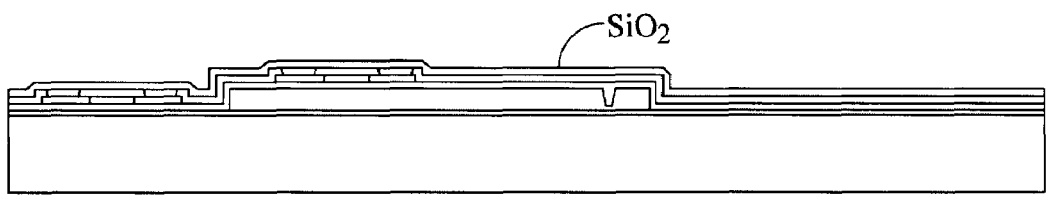
Figure 18:
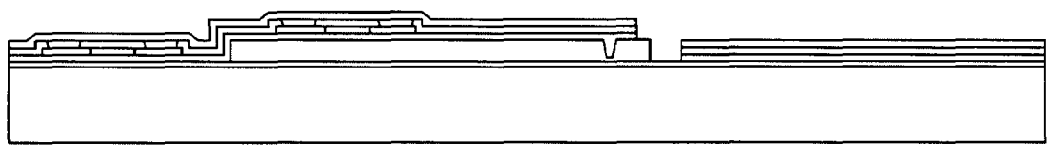
Figure 19:
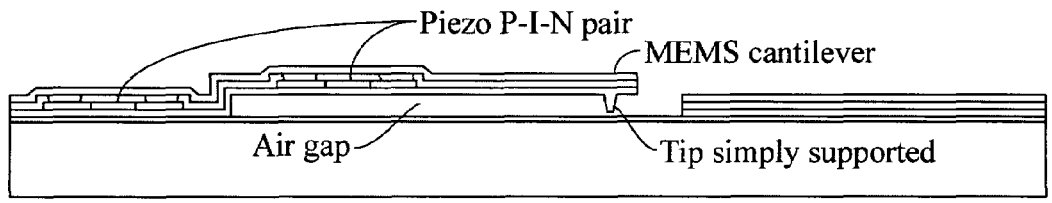

In FIG. 17 a sputter deposited layer (not explicitly shown) of Ti (100 Å)/TiN (150 Å)/AlCu (8000 Å) forms bonding pads. A PECVD process deposits 1000 Å of low stress TEOS SiO2 as passivation layer and MEMS top layer. In FIG. 18 an RIE process etches through all low stress TEOS layers to form the outline of the MEMS structure. In FIG. 19 a wet etch is performed on the a-Si to release the cantilever from the underlying substrate. In this example, a diode is also formed on the substrate adjacent the cantilever. For greater sensitivity, the cantilever diode and substrate diode currents may be contrasted. Alternately, the substrate diode may be used to amplify the cantilever diode current.

Just as solid-state device designers first focus on the electrical properties of any new film before attempting to build active devices from that material (such as low-K dielectrics or copper interconnects) MEMS designers also focus on the mechanical properties of the films before constructing devices. The most important properties are the film stress, stress gradient (e.g. how much the stress varies from the top of the film to the bottom of the film), stiffness, and behavior in various etchants since at least one material is sacrificed to form a cavity, while other films survive.

The use of glass substrates offers unique opportunities to produce surface micromachined devices with low temperature processes at a much lower cost.

TABLE 2

Comparison of Silicon vs. Glass substrates

| Attribute | Silicon substrate | Glass substrate |
| --- | --- | --- |
| Cost | moderate | Low |
| Max substrate size (m$^2$) | 1 | >2.7 |
| Optical properties | Transparent to IR | Transparent to all wavelengths |
| Electrical insulation | poor | Excellent |
| Dielectric properties | poor | Excellent |
| Biological compatibility | poor | Excellent |
| Thermal insulation | poor | Excellent |
| Max temperature | 1400 C. | 650 C. |
| Crystallographic bulk etch | yes | No |

The optical transparency of glass (other than its obvious advantage for displays) permits the creation of novel MEMS devices. For example, it is possible to optically sense the motion of a device through the substrate without requiring through-holes or expensive packaging. MEMS devices can be built on the same substrate as liquid crystal (LC) displays. This provides opportunities to build other novel devices including a compact ultrasound transducer integrated onto the same substrate as an LCD allowing for easy medical examination, a low-cost glucose monitor with integrated LCD readout for diabetics, and a wide variety of other sensor+display elements. One of the stumbling blocks when developing RF and electromagnetic MEMS devices is the effect of the silicon substrate. Typically, large quantities of substrate must be removed to improve the quality of the MEMS device. By using a glass substrate, this process is not necessary and the devices are simpler to manufacture and are more physically robust (since the substrate is intact). Additionally, many MEMS processes need to take special steps to electrically isolate individual moving elements from each other when they're all attached to the same conductive and parasitic substrate. Again, with glass, this isolation is inherently not necessary.

Microfluidic and biological applications often require materials that are bio-compatible, i.e. are biologically inert. Glass is one such material. It is simpler to start with a bio-compatible material (such as a glass substrate) than to use incompatible materials and coat them with appropriate surfaces.

Quite a few MEMS applications require thermal insulation between elements, such as bio-meters (IR sensors), field emission tips, and chemical detectors. With devices on a silicon substrate, much of the substrate must be removed to provide this thermal insulation. By using a glass substrate, each element is inherently isolated.

Figure 20:
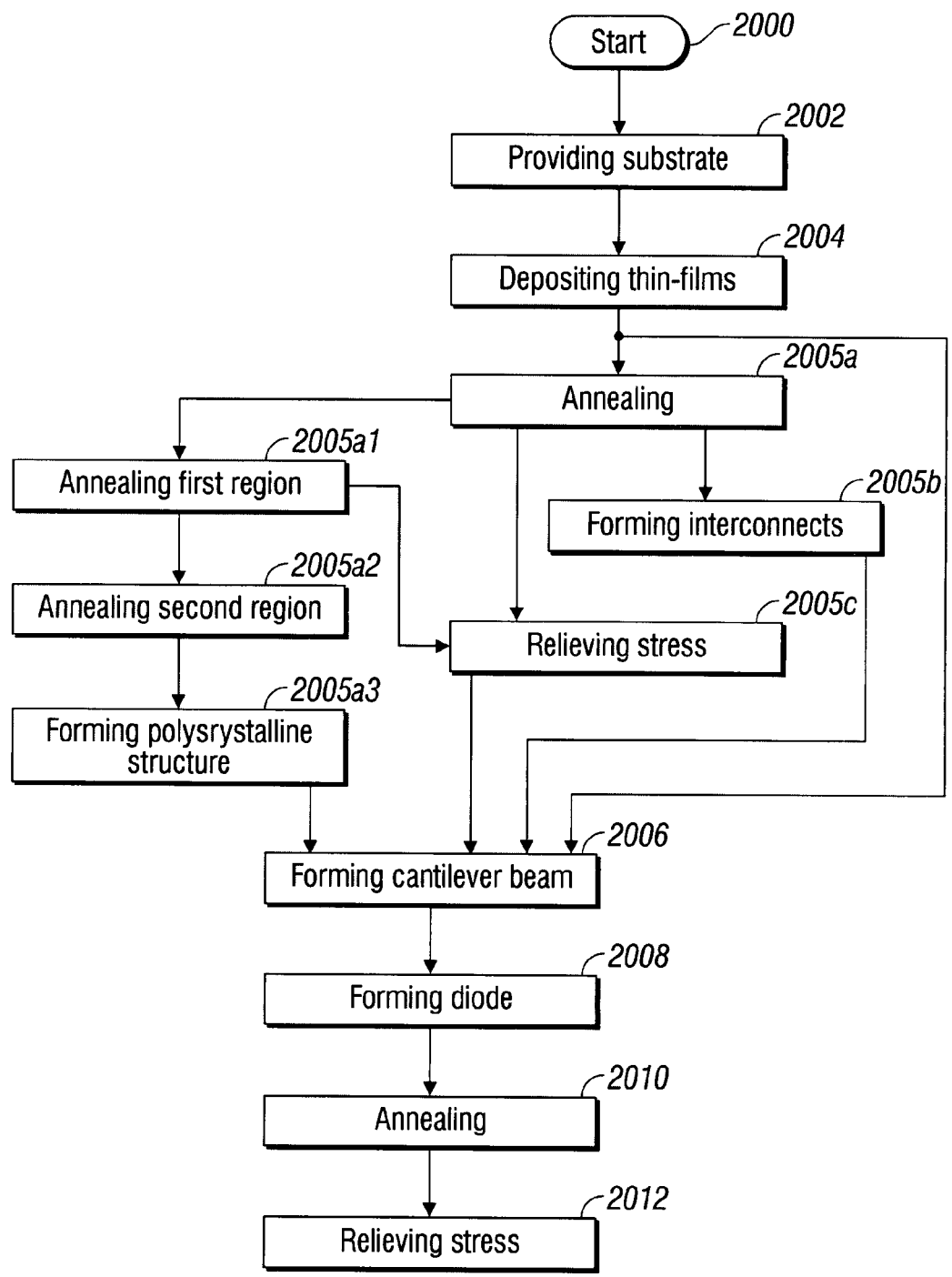
FIG. 20 is a flowchart illustrating a method for fabricating a piezo thin-film diode (piezo-diode) cantilever MEMS.

FIG. 20 is a flowchart illustrating a method for fabricating a piezo thin-film diode (piezo-diode) cantilever MEMS. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 2000.

Step 2002 provides a substrate from a material such as glass, polymer, quartz, metal foil, Si, Si-containing materials, sapphire, ceramic, or compound semiconductor materials. Step 2004 deposits thin-films overlying the substrate. Some examples of thin-film materials include a-Si, polycrystalline Si, oxides, a-SiGe, poly-SiGe, Si-containing materials, metals, metal-containing compounds, nitrides, polymers, ceramic films, magnetic films, and compound semiconductor materials. Step 2006 forms a cantilever beam from the thin-films. Step 2008 forms a diode embedded with the cantilever beam and made from a thin-film shared in common with the cantilever beam. For example, the diode may be formed from a thin-film overlying a cantilever beam top surface, a thin-film overlying a cantilever beam bottom surface, or a thin-film embedded within the cantilever beam.

In one aspect, forming the diode in Step 2008 includes forming a lateral PIN diode, having a serpentine pattern in a Si thin-film layer (see FIG. 6c). However, vertical and "L" shaped PIN diodes may also be formed. The present invention is not limited to any particular diode configuration.

In another aspect Step 2005a anneals the thin-films by heating the substrate to a temperature exceeding 800° C., subsequent to depositing the thin-films in Step 2004 (see FIG. 14). Subsequent to annealing, Step 2005b forms metal interconnects to the diode P and N electrodes (see FIG. 16). In a different aspect, Step 2005c relieves stress in the thin-films in response to the annealing (Step 2005a). Then, forming the cantilever beam in Step 2006 includes forming the cantilever beam in the stress-relieved thin-films.

In one variation, Step 2002 provides a glass substrate, sensitive to temperatures exceeding 600° C. Step 2010, subsequent to forming the diode, laser anneals selected regions of the thin-films. Then, Step 2012 relieves stress in the thin-films in response to the laser annealing.

In another variation, Step 2005a includes substeps. Step 2005a1 laser anneals a first region of the thin-films using a first annealing process. Step 2005a2 laser anneals a second region of the thin-films using a second annealing process. In response to the first annealing process, Step 2005c relieves stress in the first region of the thin-films. In response to the second annealing process, Step 2005d forms a polycrystalline structure in the second region of the thin-films. As a result, Step 2008 forms the diode in the second region.

A piezo-diode cantilever MEMS and associated fabrication processes have been provided. Examples of various materials, dimensions, designs, and process flows have been given to help illustrate the invention. However, the invention is not limited to merely these examples. Other variations and embodiments of the invention will occur to those skilled in the art.

We claim:

1. A piezo thin-film diode (piezo-diode) cantilever microelectromechanical system (MEMS), the piezo-diode cantilever comprising:
   a substrate;
   a multi-layered film cantilever beam having a distal end anchored to the substrate, and a proximal end;
   a diode embedded in the cantilever beam and sharing a film layer in common with the cantilever beam;
   wherein the cantilever beam is formed from a first film layer, made from a first material and having a first crystalline structure; and,
   wherein the diode is formed from the first film layer and has a second crystalline structure different from the first crystalline structure.

2. The piezo-diode cantilever of claim 1 wherein the cantilever beam has a top surface and a bottom surface; and
   wherein the diode is formed in a film layer selected from a group consisting of a film layer overlying the cantilever beam top surface, a film layer overlying the cantilever beam bottom surface, and a film layer embedded within the cantilever beam.

3. The piezo-diode cantilever of claim 1 wherein the cantilever beam and diode film layers are made from materials selected from a group consisting of amorphous silicon (a-Si), polycrystalline Si (poly-Si), oxides, a-SiGe, poly-SiGe, Si-containing materials, metals, metal-containing compounds, nitrides, polymers, ceramic films, magnetic films, compound semiconductor materials, and combinations of the above-mentioned materials.

4. The piezo-diode cantilever of claim 1 wherein the substrate is a material selected from a group consisting of glass, polymer, quartz, metal foil, Si, Si-containing materials, sapphire, ceramic, and compound semiconductor materials.

5. The piezo-diode cantilever of claim 1 the cantilever beam includes:
   the first film layer with a first stress level; and
   a second film layer with a second stress level overlying the first layer.

6. The piezo-diode cantilever of claim 1 wherein the cantilever beam first film layer is a Si-containing material having an amorphous crystalline structure; and,
   wherein the diode first film layer has a polycrystalline structure.

7. The piezo-diode cantilever of claim 1 wherein the cantilever beam first film layer has a first stress level responsive to the first crystalline structure; and,
   wherein the diode first film layer has a second stress level different from the first level, responsive to the second crystalline structure.

8. The piezo-diode of claim 1 wherein the diode is a lateral PIN diode, having a serpentine pattern formed in a Si film layer overlying a cantilever beam top surface.

9. The piezo-diode cantilever of claim 1 wherein the cantilever beam includes:
   a first film layer first region with a first set of electrical characteristics; and
   a first film layer second region with a second set of electrical characteristics, different from the first set of electrical characteristics.

10. A piezo thin-film diode (piezo-diode) cantilever microelectromechanical system (MEMS), the piezo-diode cantilever comprising:
   a substrate;
   a multi-layered film cantilever beam having a distal end anchored to the substrate, and a proximal end;
   a diode embedded in the cantilever beam and sharing a film layer in common with the cantilever beam; and,
   wherein the diode is a lateral PIN diode, having a serpentine pattern formed in a Si film layer overlying a cantilever beam top surface.

* * * * *